United States Patent [19]

Arnoux et al.

[11] Patent Number: 4,716,412
[45] Date of Patent: Dec. 29, 1987

[54] PLANE-STRUCTURE QUANTIFIED ANALOG DISPLAY UNIT AND ANALOG MEASURING DEVICE COMPRISING SUCH A DISPLAY UNIT

[75] Inventors: Daniel Arnoux; Claude Genter; Christian Anton; Jacques Forme, all of Paris, France

[73] Assignee: Bleris, Paris, France

[21] Appl. No.: 693,094

[22] Filed: Jan. 22, 1985

[30] Foreign Application Priority Data

Jan. 26, 1984 [FR] France .................................. 84 01177

[51] Int. Cl.⁴ .............................................. G09G 3/18
[52] U.S. Cl. ................................... 340/753; 340/754; 340/765; 324/115
[58] Field of Search ............... 340/716, 719, 753, 754, 340/755, 756, 784, 52 R, 765; 324/115, 116

[56] References Cited

U.S. PATENT DOCUMENTS

| | | | |
|---|---|---|---|
| 4,129,864 | 12/1978 | Carpenter et al. | 324/115 |
| 4,217,578 | 8/1980 | Inami et al. | 340/754 |
| 4,242,980 | 1/1981 | Go | 340/753 X |
| 4,254,489 | 3/1981 | Azzam | 340/753 |
| 4,306,233 | 12/1981 | Westbrook | 340/753 |
| 4,399,352 | 8/1983 | Ueda | 340/716 X |
| 4,461,175 | 7/1984 | Baumgart et al. | 324/115 |
| 4,491,829 | 1/1985 | McTamaney | 340/753 X |
| 4,559,534 | 12/1985 | Nickol | 340/754 |
| 4,631,513 | 12/1986 | Teshima et al. | 340/52 R |

Primary Examiner—Gerald L. Brigance
Attorney, Agent, or Firm—Wolf, Greenfield & Sacks

[57] ABSTRACT

A device for quantified analog display, with planar structure, and measurement apparatus with multiple ranges and multiple operating modes using this display, which visualizes in analog form a value of a selected measured quantity among several. The display device comprises a flat substrate (2), a succession of identical electrodes (6) arranged side by side on one face of the substrate, and selectively excitable, and with at least one graduated scale (7) adjacent to the succession of identical electrodes (6) to determine the value of the measured quantity, in combination with at least one electrode of the succession of identical electrodes. The display device is characterized in that the graduated scale (7) is situated on the face of the substrate (2) bearing the succession of electrodes (6), and comprises at least first electrodes (9,11) forming a scale, and a number of sets of second electrodes (13-18), each set including a number of electrodes combining to compose two series of numbers, with the electrodes of the scales and those of the two number series common to the two series being connected electrically to a first output terminal (S23), with those specific to the first number series being connected electrically to a second output terminal (S24), and with those specific to the second number series being connected to a third output terminal (S25).

5 Claims, 13 Drawing Figures

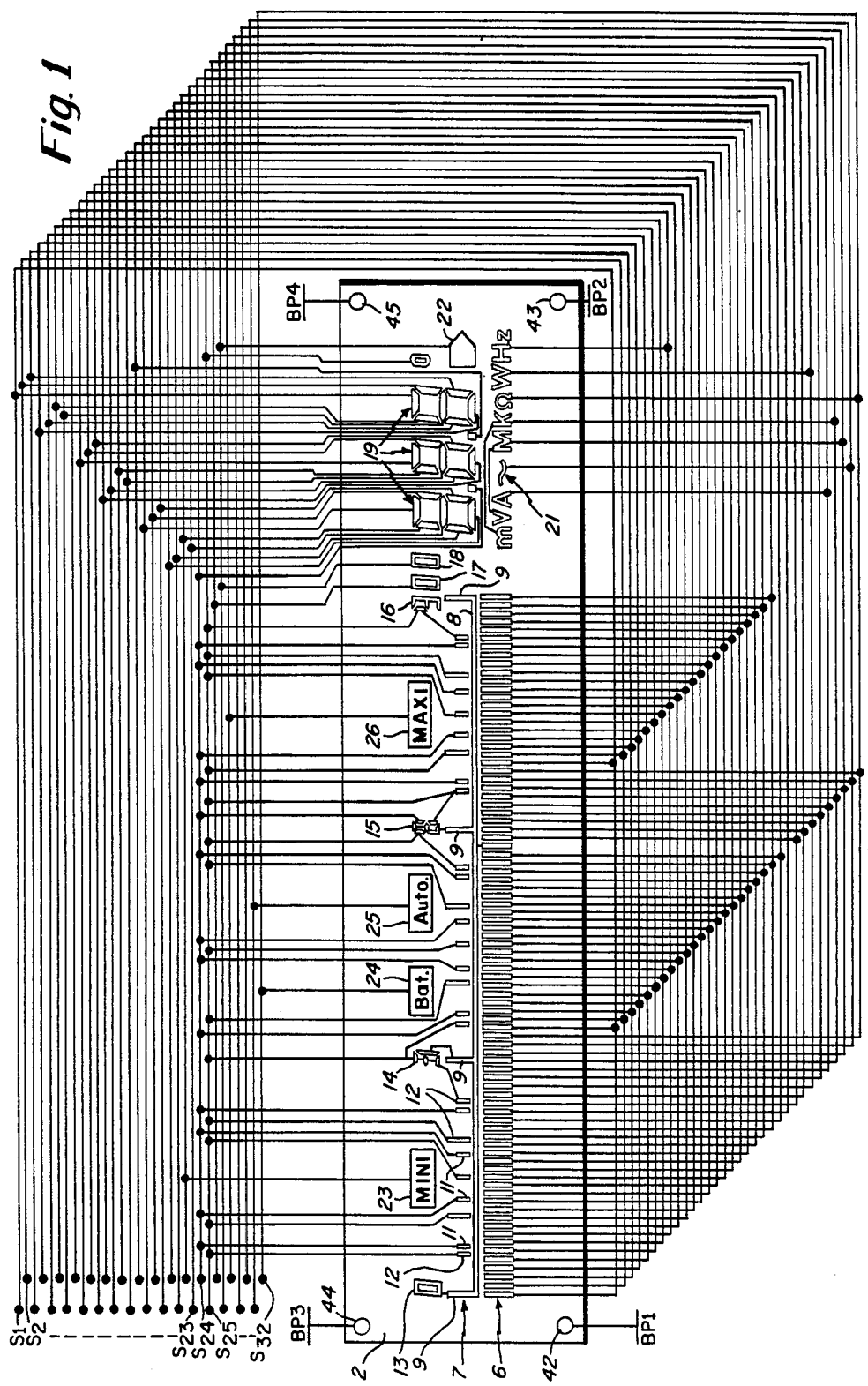

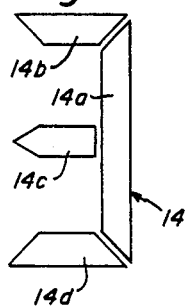
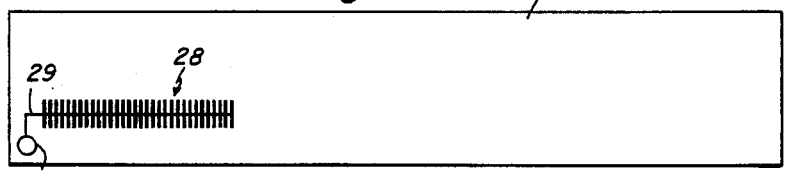
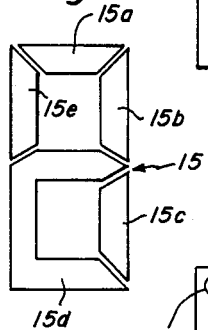
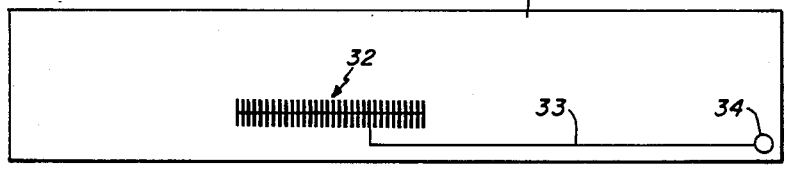
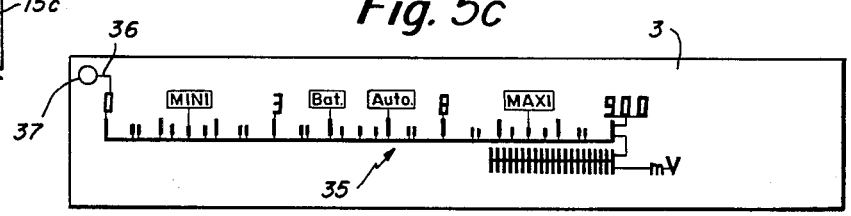
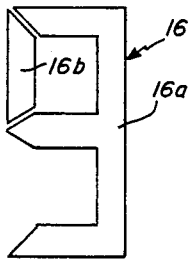
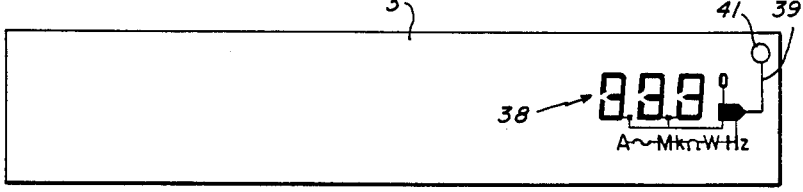

PLANE-STRUCTURE QUANTIFIED ANALOG DISPLAY UNIT AND ANALOG MEASURING DEVICE COMPRISING SUCH A DISPLAY UNIT

This invention relates to a plane-structure quantified analog display unit for analog measuring devices having several set points, comprising a flat substrate, a succession of identical electrodes arranged side-by-side on one face of the substrate and selectively excitable as a function of the value of the measured magnitude, and at least one graduated scale adjacent to the said succession of identical electrodes in order to determine the value of the measured magnitude in combination with at least one excited electrode of the said succession of identical electrodes.

The displaying of the value of a measured magnitude under a quantified analog form is already known, by lighting a more or less large number of adjacent electrodes or a single electrode among a succession of identical electrodes in the form of bars or joints, the value of the measured magnitude being read on a graduated scale facing the last of the adjacent lighted electrodes or facing the single lighted electrode. Such quantified analog display units are, for example, marketed by the "Societe BURROUGHS" under the "BARGRAPH" brand. Irrespective of the technology utilized for the display (liquid crystal, gas, fluorescent, electroluminescent or electrochemical), the measuring scale is generally engraved, printed or added by some means onto the glass or onto the housing of the display unit. In other words, the graduated scale and the electrodes used to visualize the value of the measurement are not in the same plane. As a result, there is a risk of reading error due to parallax errors and/or due to the refraction through the glass of the display unit. Moreover, where the display unit is to be used in a measing device having several set points, if there is a single graduated scale with single digitizing, the user is required to apply a coefficient to the readout value in order to obtain the real value of the measured magnitude. That entails an additional risk of error, particularly if the measuring device comprises set points which are not in a decimal ratio since, in such a case, the coefficient(s) that are to be applied to the readout values are themselves non-decimal, thereby further complicating the determination of the value of the magnitude to be measured. If the display unit comprises several graduated scales with different digitizings, the risks of error are not thereby eliminated inasmuch as there remains a risk of confusion among the graduated scales.

The present invention is essentially designed to provide a quantified analog display unit in which the abovementioned risks of readout error are eliminated, as well as to provide an analog measuring device using such a display unit.

A subsidiary purpose of the present invention is to provide a display unit which permits obtaining of both a quantified analog display and a digital display of the value of the measured magnitude.

It is already known that there are display units which provide a digital display and an analog display of the value of the measured magnitude (see, for example, the devices marketed by the Societe PHILIPS under the brand "AUTOMATIC MULTIMETER PM 2519" or the devices marketed by the Societe FLUKE under the brand "Multimetre Analogique/Numerique de poche serie 70"). In the known measuring devices of this type, the main display is the digital display, whereas the analog display is chiefly used as a tendency indicator that provides a better view of the evolving direction of the value of the magnitude to be measured when the latter is not stable. Furthermore, in the known devices of this type the graduated scale of the analog display is extremely small, or even nonexistent.

According to the present invention, the quantified analog display unit is characterized in that the graduated scale is located on the face of the substrate carrying the said succession of identical electrodes and comprises at least one first electrode forming a graduation, some second electrodes forming a first series of numbers associated with the graduation and some third electrodes forming a second series of numbers associated with the graduation; the first, second and third series of electrodes being connected electrically to terminals for their selective excitation.

Thus, at least two digitizings are associated with the graduated scale, and the appropriate digitizing can be "lighted" according to the set point used by the measuring device associated with the display unit, thereby greatly facilitating the determination of the value of the measured magnitude. In addition, since the graduated scale and the associated digitizing are located in the same plane as the succession of identical electrodes, any parallax error is eliminated.

The display unit of the present invention can also comprise, on the said face of the substrate, at least a fourth electrode forming another graduation that can be selectively "lighted" according to the set point being used. The first series of numbers can be associated with the first graduation, whereas the second series of numbers can be associated with the second graduation, and either of the two graduations and the corresponding digitizing can be selectively "lighted" according to the set point being used.

The invention will now be described by making reference to the attached drawings on which:

FIG. 1 shows the front plate of a liquid-crystal display unit conforming to the present invention and the electrical connections for the selective excitation of the front-plate electrodes.

FIG. 2, 3 and 4 show the form of certain electrodes of the front plate of FIG. 1.

FIG. 5a, 5b, 5c and 5d show the rear-plate electrodes of the liquid-crystal display unit which is associated with the front plate of FIG. 1.

In the continuation of the description it will be assumed that the display unit is of the liquid crystal type and that the measuring device into which it will be incorporated is a multimeter comprising several set points, for example set points 3, 9, 30, 90, 300 and 900, and several functions, for example, ammeter and voltmeter both a-c and d-c, ohmmeter, wattmeter, frequency meter, thermometer, etc. The description will not include certain details of the liquid-crystal display unit, as for example the polarizers and eventual reflective layers, inasmuch as these details depend upon the type of liquid-crystal display (dynamic diffusion, field effect, transmissive, transflective, reflective, etc.) and that in any event these details are well known and are not useful in understanding the present invention. Hence, the description will cover only the components of the display unit which are useful in the understanding of the invention and, in particular, the electrodes that permit visualizing selectively two graduated scales and the corresponding digitizings in function of the set point to be used, and the measuring device.

Figure 8:
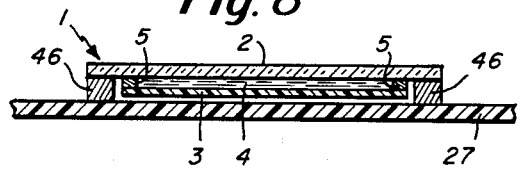
FIG. 8 is a cross-section of the liquid-crystal display unit of the present invention.

As can be particularly seen on FIG. 8, the liquid-crystal display unit 1 comprises in a known fashion a front plate 2, of isolating and transparent material, and a rear plate 3, of isolating material, between which is placed a liquid crystal 4 which is contained laterally by a liquid-tight peripheral joint. Electrodes, which will be described in detail later, are formed in a known fashion on the lower face of the front plate 2 and on the upper face of the rear plate 3. In known fashion, the electrodes of the front plate 2 have a form or a graphics corresponding to the drawing or to the characters to be displayed and, when the selected electrodes of the front plate 2 and the rear plate 3 are properly excited in known fashion, they cause a localized change of state of the liquid crystal, thereby permitting visualization of the drawing or the characters corresponding to the selected electrodes.

In FIG. 1, the electrodes which are located on the lower face of the front plate 2 are shown seen in transparency through the front plate 2. Among the electrodes of the front plate 2 is a succession of identical electrodes 6, for example, eighty-five electrodes in the form of regularly spaced vertical parallel bars, for the quantified analog display of the value of the measured magnitude. On one side of the succession of electrodes 6 there is a graduated scale 7. The scale 7 comprises an electrode having the form of a horizontal bar 8 from which extend several vertical segments 9 which form the main lines of graduation. Between each pair of main lines 9 are four electrodes 11 which form secondary lines or subdivisions of the graduation. Between each pair of main lines 9 there are also five other electrodes 12 which are intertwined with the electrodes 11 and which form secondary lines of a second graduation the main lines of which are common to the main lines 9 of the first graduation.

To each main line 9 there is associated at least one electrode 13, 14, 15 or 16 that permits visualizing numbers associated with the first and with the second graduations, respectively. In the application example described herein, the electrode 13 is alone and forms the "0" of the graduated scale which is common to both graduations. As can be seen in FIG. 2, the electrode 14 comprises an electrode segment 14a which is used for the display of the number "1" when the measuring device functions on the set point 3, 30 or 300, and three electrode segments 14b, 14c, and 14d which are connected electrically amongst themselves as shown in FIG. 1, but which are electrically isolated from electrode segment 14a, and which are used, in combination with the latter, for the display of the number 3 when the measuring device functions on the set point 9, 90 or 900. As shown in FIG. 3, the electrode 15 comprises five electrode segments 15a to 15d, the segments 15a and 15d being electrically connected to each other as shown in FIG. 1. The electrode segments 15a, 15b and 15d are used for the display of the number "2" when the measuring device functions on the set point 3, 30 or 300; and the segments 15a, 15e, 15c and 15d are used for the display of the number "6" when the measuring device functions on the set point 9, 90 or 900. Similarly, as shown in FIG. 4, the electrode 16 comprises two electrode segments 16a and 16b which are electrically isolated from each other. The segment 16a is used for the display of the number "3" when the measuring device functions on the set point 3, 30 or 300, whereas the segments 16a and 16b are used in combination to display the number "9" when the measuring device functions on the set point 9, 90 or 900. Next to the electrode 16 there are two other electrodes 17 and 18, each in the form of an "O", the electrode 17 being used when the measuring device functions on the set point 30 or 90, whereas the electrode 18 is used in combination with the electrode 17 when the measuring device functions on the set point 300 or 900.

Other electrodes are also formed on the lower face of the front plate 2, in particular a set of electrodes 19 having seven segments, plus the decimal points, for the digital display of the value of the measured magnitude, a set of electrodes 21 forming letters or symbols relative to measuring units (m for milli, V for volt, A for ampere, ~ for alternating, M for mega, k for kilo, $\Omega$ for ohm, W for watt, Hz for hertz, o for degree and an arrow 22 to eventually indicate a particular function), and other electrodes 23, 24, 25 and 26 for providing indications relative to the functioning of the measuring device. The electrode 23 (MINI) is used to indicate that the displayed value of the measured magnitude is a minimal value among a series of measured values. The electrode 24 (Bat) is used to indicate that the voltage of the battery incorporated in the measuring device has descended below a predetermined threshold. The electrode 25 (Auto) is used to indicate that the measuring device is in a mode for automatic selection of the set points. The electrode 26 (MAXI) is used to indicate that the displayed value of the measured magnitude is a maximal value among a series of measured values.

As shown in FIG. 1, certain electrode segments and certain electrodes are electrically connected between themselves by conductive metallic deposits on the lower face of the front plate 2. In all, the lower face of the front plate 2 carries one hundred twenty-eight electrode segments, electrodes or groups of electrodes which are connected to the exterior of the front plate 2 to thirty-two output terminals $S_1$ to $S_{32}$, as shown in FIG. 1, by electric connections which may consist of conductive paths formed by a printed circuit board 27 (FIG. 8), onto which the display unit is fixed. For example, the twenty-third and fifty-fifth electrodes of the electrode succession 6, the electrode segments 8 and 9 of the graduated scale 7, the electrode 13, the electrode segment 14a, the electrode segments 15a and 15d, the electrode segment 16a and one of the electrode segments of the seven-segment set of electrodes 19 are electrically connected to the output terminal $S_{23}$; the twenty-fourth and the fifty-sixth electrodes of the electrode succession 6, the electrodes 11, the electrode segment 15b and one of the two decimal points of the digital display are connected electrically to the output terminal $S_{24}$. The twenty-fifth and the fifty-seventh electrodes of the electrode succession 6, the electrodes 12, the electrode segments 15c and 15e, the electrode segment 16b and the o-form electrode (degree) are electrically connected to the output terminal $S_{25}$.

On the upper face of the rear plate 3 several electrodes are formed and shall now be described by making reference to FIGS. 5a to 5d. The rear plate 3 comprises a first electrode 28 (FIG. 5a) which corresponds to the thirty-two first electrodes of the electrode succession 6 and which is electrically connected by a connection 29 to a first conductive band 31 also formed on the rear plate 3; a second electrode 32 (FIG. 5b) which corresponds to the thirty-two following electrodes of the electrode succession 6 of the front plate 2 and which is electrically connected by a connection 33 to a second conductive band 34; a third electrode 35 (FIG. 5c) which corresponds to the twenty-one remaining electrodes of the electrode succession 6, to the electrodes 8, 9, 11 to 18 and 23 to 26 and to a portion of the electrodes 21 of the front plate 2 and which is electrically connected by a connection 36 to third conductive band 37 also formed on the rear plate 3; and a fourth electrode 38 (FIG. 5d) which corresponds to the electrodes 19, to the remaining portion of the electrodes 21 and to the electrode 22 of the front plate 2 and which is electrically connected by a connection 39 to a fourth conductive band 41 also formed on the rear plate 3. As shown in FIGS. 5a to 5d, each one of the electrodes 28, 32, 35 and 38 comprises several electrode segments electrically connected among themselves and has forms or graphics identical to those of the corresponding electrodes of the front plate 2. As a variation, each one of the electrodes 28, 32, 35 and 38 could consist of a single conductive band by being careful, however, that this conductive band does not coincide with the conductive portions of the front plate 2 which are not to be displayed. The four conductive bands 31, 34, 37 and 41 are electrically connected to four conductive bands 42, 43, 44 and 45, respectively, which are formed on the lower face of the front plate 2 and which are themselves electrically connected to four outlet terminals BP1, BP2, BP3 and BP4, respectively. Thus, all the outputs of the display unit 1 are located in the same plan and may be electrically connected to the printed circuits of the plate 27 by connection pieces 46 as shown in FIG. 8.

In the application example described above, four electrodes 28, 32, 35 and 38 are provided on the rear plate 3. That permits multiplexing (quadruplexing in the present case) the one hundred twenty-eight electrodes (including the exterior connections) of the front plate 2 and, consequently, reducing to thirty-two the number of the connections to the display controller 47 (FIG. 10) which controls the display unit 1. Of course, it is possible to provide multiplexing different from that shown in FIG. 1 by using a greater or lesser number of electrodes on the rear plate 3.

It will be noted that, in operation, irrespective of the set point used in the measuring device, the output terminals $S_{23}$ and BP3 are excited in an appropriate manner so as to permanently "light" the electrode 13 and the electrode segments 8, 9, 14a, 15a, 15d and 16a. The output terminal $S_{24}$ is excited at the same time as the output terminals $S_{23}$ and BP3 when the measuring device functions on the set point 3, 30, 300 to "light" the electrodes 11 and the electrode segment 15a. The output terminal $S_{25}$ is excited at the same time as the output terminals $S_{23}$ and BP3 when the measuring device functions on the set points 9, 90 or 900, to "light" the electrodes 12 and the electrode segments 14b, 14c, 14d, 15c, 15e and 16b.

Figure 6:
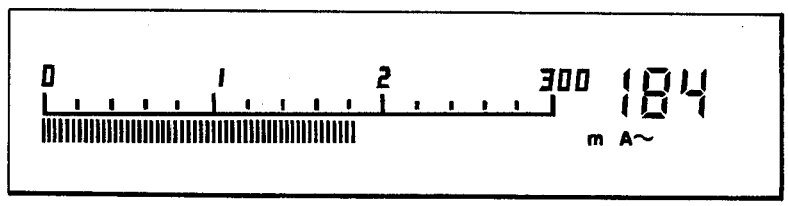
FIG. 6 and 7 illustrate two display examples.
Figure 7:
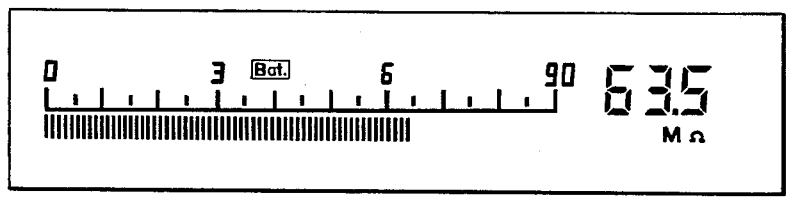

FIG. 6 shows, as an example, the graduated scale that is displayed when the measuring device functions on the set point 300mA~, whereas FIG. 7 shows the graduated scale when the measuring device functions on the set point 90MΩ. FIGS. 6 and 7 also show, as an example, the value of the magnitude being measured under quantified analog form and under digital form.

Figure 9:
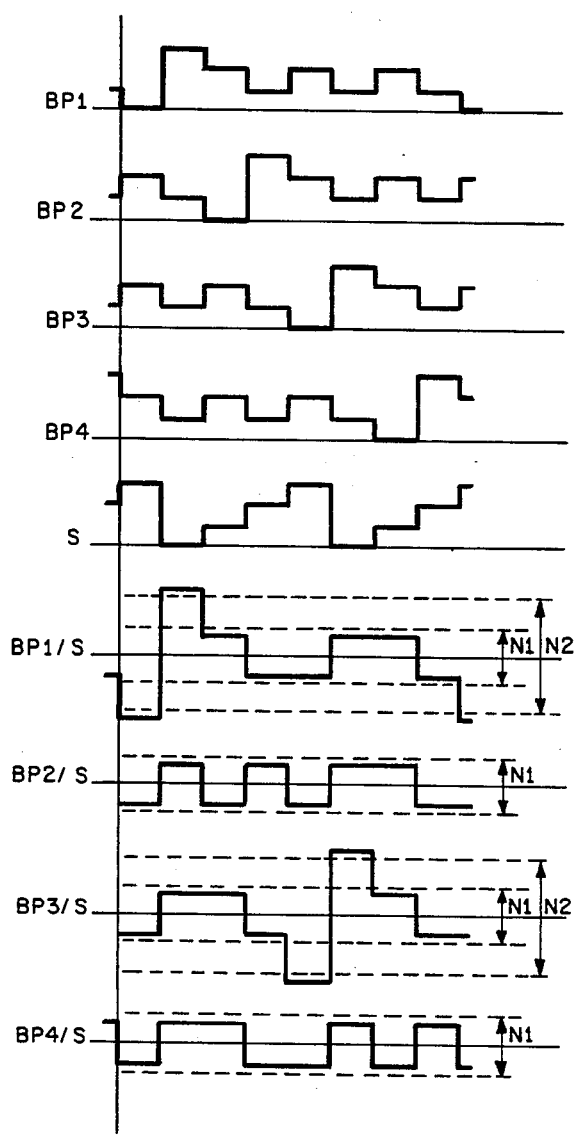
FIG. 9 is a diagram showing the wave shape of the command signals for the display unit of the present invention.

In service, the display unit 1 receives, by means of the display controller 47 (FIG. 10), the command signals that enable selective "lighting" or "extinguishing" of the one hundred twenty-eight electrodes of the front plate 2, that is, visualizing or erasing the symbols, characters and drawings corresponding to these one hundred twenty-eight electrodes. These command signals comprise, on the one hand, the four command signals of the four electrodes 28, 32, 35 and 38 of the rear plate 3 and, on the other hand, the thirty-two command signals of the thirty-two groups of four electrodes of the front plate 2, each electrode of each group corresponding to an identical electrode segment of one of the four electrodes of the rear plate 3. all these command signals are recurrent and have an elementary cycle of eight successive phases, each of the rear plate 3 being activated during two successive phases. Each command signal applied to an electrode of the rear plate 3 comprises the level succession 0-V for the phases corresponding to the activated electrode and the succession of levels 2V/3-V/3 for the other phases. The upper portion of FIG. 9 shows the four command signals corresponding to the four electrodes 28, 32, 35 and 38 of the rear plate 3. These four signals are respectively designated by BP1, BP2, BP3 and BP4, that is, by the terminals to which they are applied. It will be noted that the second, the third and the fourth command signals correspond to the first shift-phase command signal of two, four and six phases, respectively.

The command signals applied to the electrodes of the front plate 2 vary with the desired display. When the electrode corresponding to an activated phase is to be lighted, the level succession V-0 is applied to it. If it is to be extinguished, the level succession V/3-2V/3 is applied. Hence, if in a group of electrodes of the front plate 2 it is necessary to have the lighting of those which correspond to the electrodes 28 and 35 of the rear plate 3 and the extinction of those which correspond to the electrodes 32 and 38 of the rear plate 3, the level succession V-0-V/3-2V/3-V-0-V/3--2V/3 will be applied to the corresponding terminal S as indicated in S in FIG. 9. In this case, the four command signals appearing between the electrodes 28, 32, 35 and 38 of the rear plate 3 and the corresponding electrode S of the front plate 2 have been shown in the lower portion of FIG. 9 and are designated respectively by BP1/S, BP2/S, BP3/S and BP4/S. On the four corresponding diagrams, there is the level N1 which ensures the extinction of one electrode of the front plate 2 and the level N2 which ensures its lighting with the optimum contrast. On these four diagrams it is noted that only the signals BP1/S and BP3/S applied to the electrodes of the front plate 2 which are associated with the electrodes 28 and 35 of the rear plate 3 (BP1 and BP3) go beyond the level N2 and cause the lighting of the corresponding electrodes, while the signals BP2/S and BP4/S applied to the electrodes of the front plate 2 which are associated with the electrodes 32 and 38 of the rear plate 3 (BP2 and BP4) remain below the level N1 and, therefore, do not trigger the lighting of the corresponding electrodes. It seems, moreover in these diagrams that the average values of the signals are null, which is the condition required for the proper functioning of certain display units, in particular, liquid-crystal display units.

Figure 10:
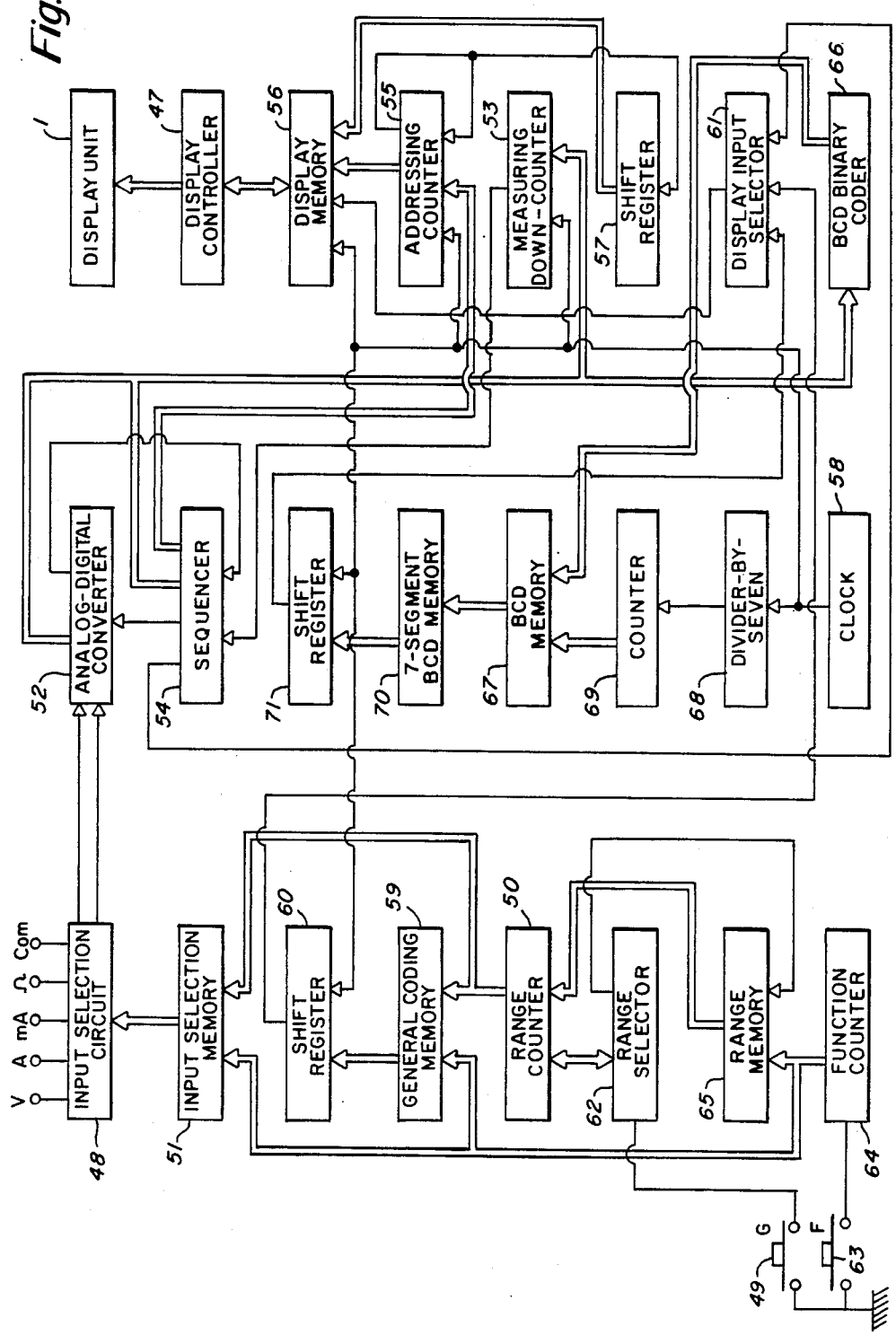
FIG. 10 is the block diagram of a measuring device comprising a display unit conforming to the present invention.

The measuring device whose block diagram is shown in FIG. 10 comprises, in addition to the display unit and the display controller 47 previously mentioned, an input-selection circuit 48 capable of receiving at least an input measurement signal which is applied between a common terminal "Com" and one of the input terminals "V", "A", "mA" and "Ω"; a range-selection key 49; a range counter 50 which reacts to the activation of the range-selection key 49; an input-selection memory 51 which is connected to the output of the range counter 50 and which adapts the input-selection circuit 48 to a selected range by the range-selection key 49; an analog/digital converter 52 which is connected to the output of the input-selection circuit 48; a measuring counter 53 which is connected to the output of the analog/digital converter 52; a sequencer 54 which is connected to the output of the measuring down-counter 53; an addressing counter 55 which is connected to the output of the sequencer 54; a display memory 56 which comprises 32 four-bit words whose first input is connected to the output of the addressing counter 55 and whose output is connected to the display controller 47; a first shift register 57 having a four-bit parallel output whose input is connected to the output of the addressing counter 55 and whose output is connected to a second input of the display memory 56; and a clock 58 whose output is connected to clock inputs of the measuring down-counter 53, the addressing counter 55 and the display memory 56.

According to the present invention, the measuring device also comprises a general coding memory 59 which is connected to the output of the range counter 50, a second shift register with a series output 60, whose clock input is connected to the output of the clock 58 and whose data input is connected to the output of the general coding memory 59, and a display-input selector 61 having a first input connected to the output of the sequencer 54 and a second input connected to the output of the second shift register 60, and whose output is connected to a third input of the display memory 56.

For the automatic selection of the measuring ranges or set points, the measuring device may comprise an automatic range selector 62 whose input is connected to the range-selection key 49 and whose output is connected to the range counter 50. In the case where the measuring device is a multifunction device, it may also comprise a function-selection key 63, a function counter 64 whose input is connected to the function-selection key 63 and whose output is connected to the input-selection memory 51, and a range memory 65 having a first input connected to the output of the function counter 64 and a second input connected to the output of the range selector 62, and whose output is connected to the range counter 50.

When the measuring device is also designed for the digital display of the value of the measured magnitude, it also comprises a BCD (binary-coded decimal) coder 66 which is connected to the output of the analog/digital converter 52 and to the output of the sequencer 54, a BCD memory 67 having three four-bit words (each word corresponding to one of the three electrodes of the seven-segment electrode set 19), which has a first input connected to the output of the BCD coder 66, a divider-by-seven 68 which is connected to the output of the clock 58, a parallel-output binary counter 69 whose input is connected to the output of the divider-by-seven 68 and whose outputs are connected to a second input of the BCD memory 67, a seven-segment BCD memory 70 connected to the output of the BCD memory 67, and a third shift register 71 with a series output and having a clock input connected to the clock 58 and a data input connected to the output of the seven-segment BCD memory 70, and whose output is connected to a third input of the display-input selector 61.

The functioning of the measuring device will now be described. The state of the lighted or extinguished electrodes is provided, upon interrogation of the display controller 47, by the display memory 56 which comprises thirty-two four-bit words. In each word, the bit of like weight is assigned to the same electrode 28, 32, 35 or 38 of the rear plate 3, whereas each of the thirty-two words is assigned to one of the thirty-two groups of electrodes of the front plate 2.

The display memory 56 is loaded from three sources of information:

1. Information relative to the analog display of the value of the measured magnitude.
2. Information relative to the digital display of the value of the measured magnitude.
3. General information relative to the other displays.

The bit corresponding to each electrode is loaded in the display memory 56 at the address given by the addressing counter 55.

The loading of the information relative to the three sources of information will now be successively described.

LOADING OF INFORMATION RELATIVE TO THE ANALOG DISPLAY

The display value of the measured magnitude is converted into digital form by the analog/digital converter 52 and is initially loaded in the measuring down-counter 53. At the start of the functioning cycle, the display memory 56 is set at zero, the addressing counter 55 is loaded with the starting address, a high state is applied to the data input of the display memory 56, and the shift register 57 is loaded with a four-bit word having "1" in its first bit position.

To start the loading of information relative to the analog display, the pulses of the clock 58 are applied to the addressing counter 45 which successively addresses the positions of the display memory 56. The high state on the data input of the display memory 56 is recorded in the latter, in the selected bit position by the shift register 57, at each pulse of the clock 58. During this time, the measuring down-counter 53 is incremented at each pulse of the clock 58. When the last address is entered in the memory display 56, the overflow of the addressing counter 55 advances the "1" signal in shift register 57 one bit position, so that a "1" will be registered in the display memory 56 at the bit of immediately greater weight. At the same time the addressing counter 55 is loaded to its departure address [i.e., re-set].

When the measuring down-counter 53 reaches zero, the operation is stopped. The number of bits at the state "1" which were loaded into the display memory 56 for the lighting of a corresponding number of electrodes of the electrode succession 6 of the front plate 2 is then equal to the value loaded initially into the measuring down-counter 55. At that point, the data input of the display memory 56 is brought to the low state.

LOADING OF INFORMATION RELATIVE TO THE DIGITAL DISPLAY

The display value of the measured magnitude is coded by the BCD 66 and stored in the three four-bit word memory 67. This memory 67 is addressed by the parallel-output binary memory 69 which receives, by means of the divider-by-seven 68, the pulses from the clock 58.

The output of the memory 67 addresses the memory 70 which, for each of the addresses corresponding to the digits "0" to "9", causes the appearance of the combination of states commanding the lighting of the first seven-segment electrode of the set of electrodes 19 corresponding to the first digit of the digital value of the measured magnitude to be displayed. This combination of states is loaded into the shift register 71 having a series output which, at each pulse of the clock 58, supplies to the display memory 56, addressed by the addressing counter 55 and by the shift register 57, the level corresponding to the state of one of the seven segments of the digit to be displayed. At the start of the display cycle, the shift register 57 is loaded so as to register the bits relative to the electrode 38 of the rear plate 3 associated with the seven-segment electrode set 19 of the front plate 2. Furthermore, at the start of the digital display, the sequencer 54 loads the addressing counter 55 to its original address and the measuring down-counter 53 to 21 (three times seven segments). Every seven clock pulses, a new position of the memory 67 corresponding to the following digit to be displayed is addressed by the counter 69. The operation stops when the measuring down-counter 53 reaches zero. The data input of the memory display 56 is then returned to zero.

LOADING OF GENERAL INFORMATION

General information comprises the symbols relative to the analog display (graduations 9, 11, 12, digitizing 13 to 16 of the graduated scale 7 and the two zeros 17 and 18 for the decimal factors of the digitizing), the symbols relative to the measurement units (V, A, Ω, V, Hz, o and ~), the symbols relative to the three prefixes (m, M and k) and the functional symbols relative to the operating modes or to the signaling of abnormal operations (MINI, MAXI, Auto and Bat). The symbols other than the functional symbols depend upon the measured magnitude and the selected range or set point.

The selection of the function and the selection of the range or set point are effected, respectively, by means of the function key 63 and the range key 49. Each time that the function key is activated, it decrements the function counter 64 and each time that the range key 49 is activated it decrements the range counter 50. Each time that the function counter 64 reaches zero, it is reloaded to a maximal value corresponding to the number of functions of the measuring device.

Each time that the range counter 50 reaches zero, the measuring device passes into the "automatic range change" mode. This mode is memorized in the range selector 62 which assumes the management of the range change by decrementing the range counter 50 when the value of the measured magnitude exceeds the maximal measuring capacity, and by incrementing the range counter 50 when the value of the measured magnitude is less than one third of this maximal capacity.

During the operation in automatic range change mode, the activating of the range key 49 returns the measuring device to the "manual range change". During the passage from one mode to the other or in the automatic range change mode when the range counter 50 reaches zero, it is reloaded to the maximal possible value for the utilized function, this value being supplied by the range memory 65 which comprises as many four-bit words as it does possible functions and which is addressed by the function counter 64.

The function counter 64 and the range counter 50 address the general coding memory 59 which comprises, for each function-range combination, a 16-bit word corresponding to the sixteen electrodes involved in the display of the symbols relative to the ranges and to the functions. This word is loaded into the shift register 60 having a series output and is transferred bit by bit into the display memory 56 at each pulse of the clock 58.

At the start of the loading of general information, the addressing counter 55 and the shift register 57 are loaded by the sequencer 54 to the values addressing the first bit to be inscribed. Similarly, at the start of the loading of the general information, the measuring down-counter is loaded to 16 by the sequencer 54. The loading of the general information is stopped when the measuring down-counter 53 reaches zero.

The selection of the source of information to be memorized in the display memory 56 (analog display, digital display or general display) is effected by the display input selector 61 which receives on its three inputs the signals supplied respectively by the sequencer 54, the shift register 71 and the shift register 60 and which selects these signals in function of the state of the sequencer 54.

At first, the sequencer 54 takes a first state which gives the analog/digital converter 52 the order to effect a conversion. When the latter is terminated, the converter 52 commands the passage to the following state of the sequencer 54 which, secondly, loads the original address of the analog display into the addressing counter 55 and which selects, by means of the display input selector 61, a high level for the bit positions of the display memory 56 corresponding to the electrodes to be lighted of the electrode succession 6.

When the measuring down-counter 53 reaches zero at the end of this second time, the sequencer 54 passes to the following state which loads, in a third time, the original address of the digital display into the addressing counter 55 and which selects, by means of the display input selector 61, the output of the shift register 71 for the lighting of the appropriate segments of the seven-segment electrodes of the electrode set 19.

When the measuring down-counter 53 reaches zero at the end of this third time, the sequencer 54 passes to the following state which, in a fourth time, loads the original address of the general display into the addressing counter 55 and which selects, by means of the display input selector 61, the output of the shift register 60 for the lighting of the appropriate electrodes relative to the function and to the range being used. When the measuring down-counter 53 reaches zero at the end of the fourth time, the sequencer comes back to the initial state and the cycle begins again.

The analog/digital converter 52, which delivers the value of the measured magnitude under digital form, accepts the signal coming from the input selection circuit 48. This circuit 48, of classic design, comprises voltage dividers adapting the input voltage to the measuring scope of the converter 52, shunt resistance which bring the measurement of a current to a voltage measurement, and a source of current (battery) which delivers a current that, in passing in a measuring resistance, supplies a voltage to the converter 52. The selection among the various input configurations in the input selection circuit 48 is provided in classic manner by static commutators whose command signals are supplied by the input selection memory 51 which is addressed by the function counter 64 and by the range counter 50.

It goes without saying that the form of execution of the present invention which has been described hereinabove has been given purely as an example for illustration purposes and is not at all restrictive, and numerous modifications may be made by the skilled person without thereby departing from the framework of the present invention. It is such that although the present invention has been described in making special reference to a liquid-crystal display unit, it is also applicable to plane-structure display units using other technologies referenced in the preamble of the description.

We claim:

1. A quantified analog display device which displays a selected measured quantity in analog form, comprising:
   a flat substrate;
   a plurality of selectively excitable bar electrodes arranged side by side on one face of the substrate;
   a first set of scale electrodes on the one face of the substrate;
   a second set of scale electrodes on the one face of the substrate;
   a third set of scale electrodes on the one face of the substrate; and
   means for interconnecting said first, second and third sets of scale electrodes to first, second and third terminals, respectively, so as to define a first scale having a first range when said first and second terminals are energized and to define a second scale having a second range when said first and third terminals are energized, said first and second scales each including graduations and associated digits to indicate the range of values being displayed, the digits of the first and second scales having common electrodes and being commonly located adjacent said bar electrodes, whereby said display device can display measured quantities in at least two different ranges of values.

2. A display device according to claim 1 wherein said first and second scales include different interdigitated graduations.

3. A display device according to claim 1, characterized in that it includes a set of selectively excitable electrodes forming symbols corresponding to units characterizing various measured quantities and modes of operation of an associated measurement apparatus.

4. A display device according to claim 3, characterized in that it includes a set of selectively excitable electrodes to form various seven-segment numbers, enabling display of the value of the measured quantity in numeric form, in addition to analog display.

5. A display device according to claim 4, of the liquid crystal type, comprising said substrate, a back plate composed of an insulating material, and a liquid crystal placed between the substrate and the back plate, said substrate comprising a transparent insulating material on which said electrodes are formed.

* * * * *